United States Patent
Hsu et al.

(10) Patent No.: US 12,282,260 B2
(45) Date of Patent: Apr. 22, 2025

(54) METHOD FOR CLEANING SUBSTRATE, METHOD FOR MANUFACTURING PHOTOMASK AND METHOD FOR CLEANING PHOTOMASK

(71) Applicant: TAIWAN SEMICONDUCTOR MANUFACTURING COMPANY LTD., Hsinchu (TW)

(72) Inventors: Yu-Hsin Hsu, Taichung (TW);
Hao-Ming Chang, Pingtung (TW);
Shao-Chi Wei, Hsinchu (TW);
Sheng-Chang Hsu, New Taipei (TW);
Cheng-Ming Lin, Yunlin County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 600 days.

(21) Appl. No.: 17/560,974

(22) Filed: Dec. 23, 2021

(65) Prior Publication Data
US 2022/0113631 A1    Apr. 14, 2022

Related U.S. Application Data

(62) Division of application No. 16/276,468, filed on Feb. 14, 2019, now Pat. No. 11,209,736.

(60) Provisional application No. 62/750,476, filed on Oct. 25, 2018.

(51) Int. Cl.
*G03F 7/40* (2006.01)
*G03F 1/82* (2012.01)

(52) U.S. Cl.
CPC . *G03F 7/40* (2013.01); *G03F 1/82* (2013.01)

(58) Field of Classification Search
CPC . G03F 7/423; G03F 7/40; G03F 7/425; G03F 7/428
See application file for complete search history.

(56) References Cited

U.S. PATENT DOCUMENTS

| 6,848,455 B1 | 2/2005 | Shrinivasan et al. |
| 2003/0116173 A1 | 6/2003 | Humenik et al. |
| (Continued) | | |

FOREIGN PATENT DOCUMENTS

| CN | 104181781 A | 12/2014 |
| CN | 106896637 A | 6/2017 |

OTHER PUBLICATIONS

Office Action, Cited References and Search Report dated Jan. 28, 2022 issued by the China National Intellectual Property Administration for the Chinese counterpart application No. 201910973167.9 (provided with brief translation).

(Continued)

*Primary Examiner* — Daborah Chacko-Davis
(74) *Attorney, Agent, or Firm* — WPAT LAW; Anthony King

(57) ABSTRACT

A method for cleaning is provided. The method includes: removing a pellicle frame from a top surface of a photomask by debonding an adhesive between the photomask and the pellicle frame, wherein a first portion of the adhesive is remained on the top surface of the photomask, and removing the first portion of the adhesive on the top surface of the photomask, including applying an alkaline solution to the top surface of the photomask, and performing a mechanical impact to the photomask.

20 Claims, 24 Drawing Sheets

(56) References Cited

U.S. PATENT DOCUMENTS

2017/0031241 A1\* 2/2017 Shen .................... B08B 3/12
2018/0031962 A1\* 2/2018 Chou .................. B08B 7/0042

OTHER PUBLICATIONS

Brief English Translation/Summary of the Office Action, Cited References dated Jan. 28, 2022 issued by the China National Intellectual Property Administration for the Chinese counterpart application No. 201910973167.9.
English Abstract of CN106896637A.
English Abstract of CN104181781A.

\* cited by examiner

METHOD FOR CLEANING SUBSTRATE, METHOD FOR MANUFACTURING PHOTOMASK AND METHOD FOR CLEANING PHOTOMASK

PRIORITY CLAIM AND CROSS-REFERENCE

This application is a divisional application of prior-filed U.S. application Ser. No. 16/276,468, filed Feb. 14, 2019, and claims the benefit of prior-filed provisional application No. 62/750,476, filed on Oct. 25, 2018.

BACKGROUND

A typical semiconductor manufacturing process includes numerous steps, for example, lithography is a crucial step which would greatly affect the semiconductor structure at early manufacturing stage. The basic principle of lithography is similar to that of film photography. The patterns of a photomask are projected through a high-precision lithography tool onto the wafer surface, which is coated with a layer of a light-sensitive chemical compound, e.g. photoresist. Patterns of the photomask are then transferred to the wafer surface through cross link reactions, development, post-exposure baking, and wet or dry etching.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
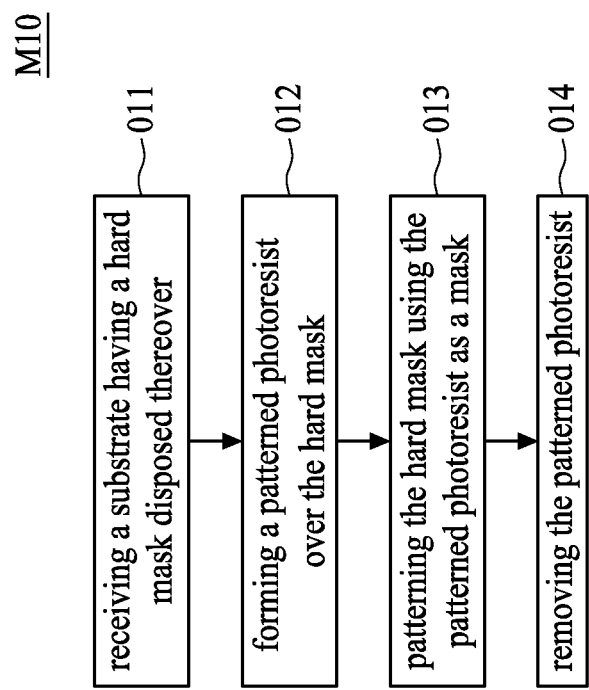
FIG. 1 is a flowchart of various steps of a method for manufacturing a photomask in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to +5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±40, less than or equal to ±3°, less than or equal to ±2°, less than or equal to ±1, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1, less than or equal to ±0.5°, less than or equal to ±0.1°, or less than or equal to +0.05°.

In order to transfer the pattern of the photomask accurately onto a layer on a semiconductor wafer or a semiconductor substrate, keeping the photomask used in a semiconductor manufacturing process free of contaminants plays an important role. Contaminants on the photomask can result in low resolution or undesired patterns of the layer on the semiconductor substrate. During the formation of the photomask, one or more cleaning processes are performed between operations for good result of a pattern formation of the photomask. In a manufacturing process of the photomask, polymeric materials used in the formation of the patterns of the photomask, however, are difficult to remove. For instance, a photosensitive polymeric material or adhesive materials containing a cross-linked structure is formed after light exposure during the lithographic operation. The photosensitive polymeric material or adhesive materials possesses a more compact component due to cross linking effect. Cross linking effect is the redistribution of the frame structure which results to hardened bulk material. The hardened material prevent cleaning chemical from penetration and further remove said material. Furthermore, photosensitive polymeric material or adhesive materials usually possesses with large and flattened surface that leads to a large Van der Waals force that raises the difficulty of removal. Chemical solution capable of reducing electrostatic force by bond breaking combines with mechanical impact (e.g., nozzle spraying or megasonic cleaning) can hardly removes the cross-linked photosensitive polymeric material or adhesive materials. One way to facilitate removal of the polymeric materials is to provide oxidizing/reducing agents, but removal results may not be satisfactory due to the stable structure of the polymeric materials. In addition, options for the oxidizing/reducing agents to be used are limited to avoid unwanted damage to the underlying target layer or substrate.

Figure 2:
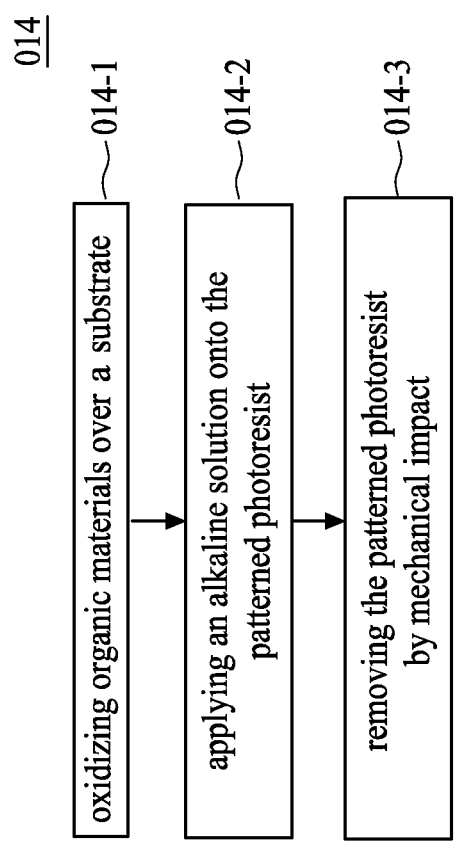
FIG. 2 is a flowchart of various sub-steps of one or more steps shown in FIG. 1 in accordance with some embodiments of the present disclosure.

Referring to FIG. 1, in accordance with some embodiments of the present disclosure, a method M10 for manufacturing a photomask is provided. The method M10 includes: (O11) receiving a substrate having a hard mask disposed thereover; (O12) forming a patterned photoresist over the hard mask layer; (O13) patterning the hard mask using the patterned photoresist layer as a mask; and (O14) removing the patterned photoresist. In accordance with some embodiments of the present disclosure, as shown in FIG. 2, the operation (O14) includes: (O14-1) oxidizing organic materials over the substrate; (O14-2) applying an alkaline solution onto the patterned photoresist; and (O14-3) removing the patterned photoresist by mechanical impact.

To further illustrate concepts of the present disclosure, FIGS. 3 to 8 are provided in accordance with some embodiments for purposes of ease of understanding but are not intended to limit the present disclosure. In some embodiments, FIGS. 3 to 8 illustrate a method for mask manufacturing.

Figure 3:
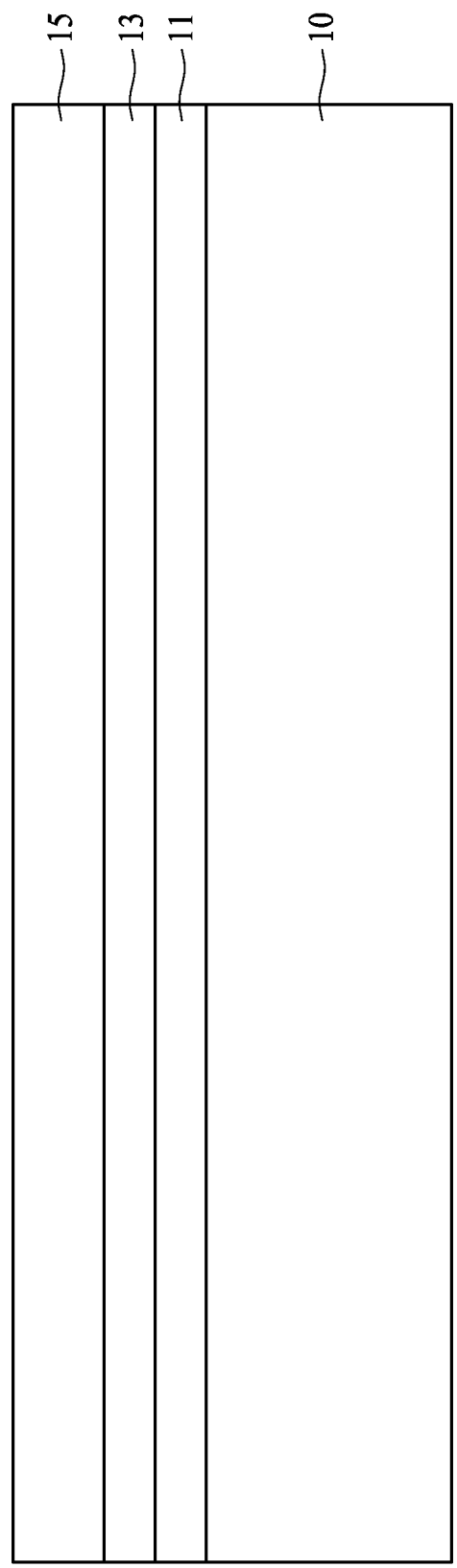
FIGS. 3 to 8 are cross-sectional views of one or more operations of a method for forming a photomask in accordance with some embodiments of the present disclosure.
Figure 4:
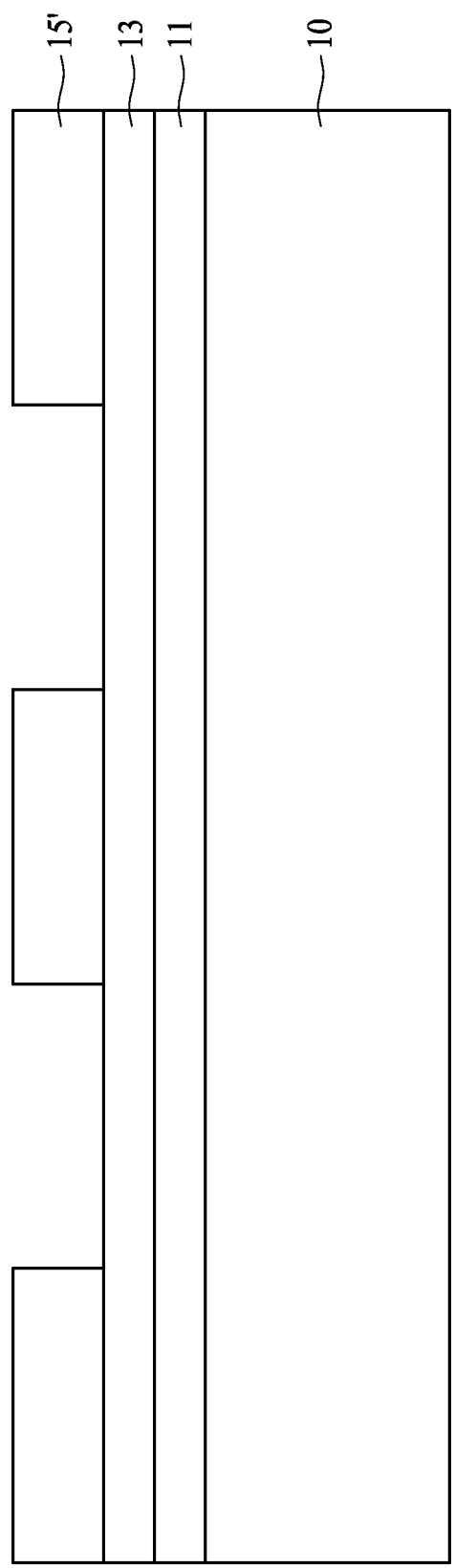

Referring to FIG. 3, in accordance with the operation (O11) and some embodiments of the present disclosure, a substrate 10 is received. In some embodiments, the substrate 10 can be transparent to the light illuminating thereon in subsequent lithography operations. A target layer 11, a hard mask 13 and a photoresist 15 are formed in sequence on the substrate 10. In accordance with the operation (O12) and some embodiments of the present disclosure, the photoresist 15 is patterned to form a patterned photoresist layer 15' as shown in FIG. 4. The patterned photoresist layer 15' can be formed by exposure, post exposure baking (PEB), developing, or other lithographic operations. In some embodiments, the substrate 10 includes quartz, silicon, silicon oxide, aluminosilicate glass, calcium fluoride, magnesium fluoride, or other suitable materials. In some embodiments, the target layer 11 includes metal silicide, such as a titanium silicide, a molybdenum silicide and/or a tungsten silicide. In some embodiments, the metal silicide is formed by sputtering or other suitable process. In some embodiments, the hard mask 13 includes metal. In some embodiments, the hard mask 13 includes chromium and/or a chromium compound. In some embodiments, the chromium compound includes chromium oxide, chromium oxide nitride, chromium oxide carbide, or chromium oxide nitride carbide.

The photoresist 15 includes photosensitive polymeric materials or light-activated resin. In some embodiments, the photoresist 15 includes carboxylic acid resin, alcohol compound resin, acrylic resin, acrylic-epoxy resin, acrylic-styrene resin, phenol-novolak resin, or other suitable materials. In some embodiments, the photoresist 15 includes photoinitiator.

In some embodiments, the photoresist 15 is a negative photoresist. A polymerization is induced by light after the exposure operation. A portion of the photoresist layer 15 that is exposed to light is polymerized (i.e., undergoes light-induced polymerization, or cross-linked reactions) and becomes insoluble to a photoresist developer. The unexposed portion of the photoresist layer 15 is dissolved in the photoresist developer and is removed to form the patterned photoresist layer 15' as shown in FIG. 4. The patterned photoresist layer 15' includes crosslinked polymer chains.

In some embodiments, the photoresist 15 is a positive photoresist. A portion of the photoresist 15 that is exposed to light becomes soluble to a photoresist developer. The unexposed portion of the photoresist 15 remains polymerized and insoluble to the photoresist developer. The exposed portion of the photoresist 15 is removed by an operation involving dissolving the exposed portion by the photoresist developer. As a result, the patterned photoresist layer 15' is formed as shown in FIG. 4. The patterned photoresist layer 15' includes crosslinked polymer chains.

Figure 5:
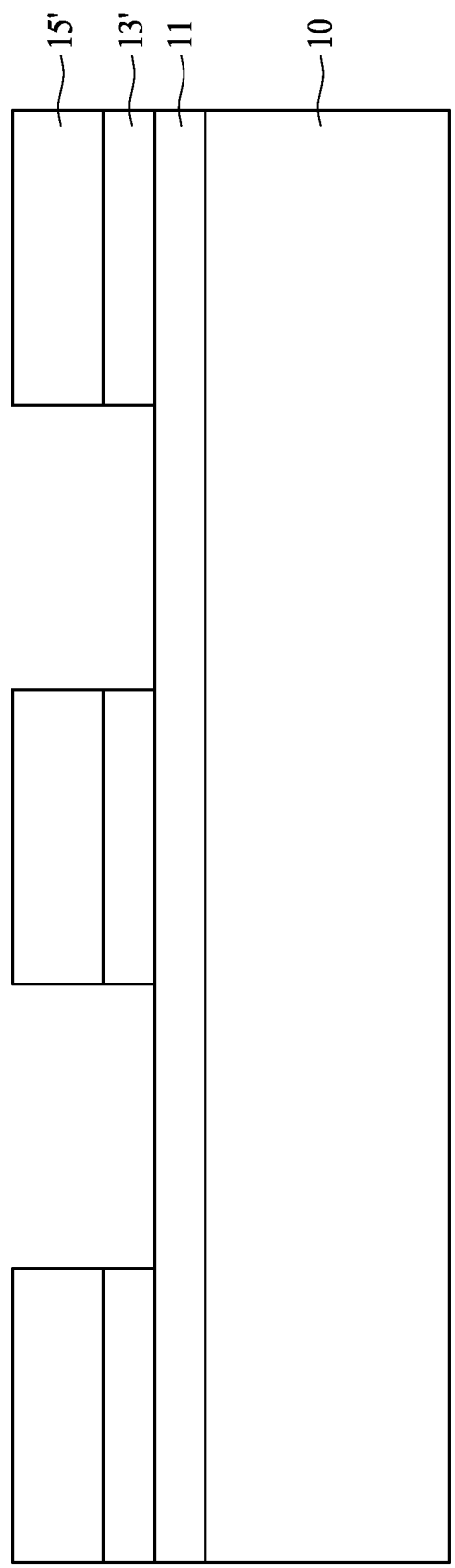

Referring to FIG. 5, in accordance with the operation (O13) and some embodiments of the present disclosure, the hard mask 13 is patterned to form a patterned hard mask 13' using the patterned photoresist layer 15' as a mask. The patterned hard mask 13' is formed by an etching operation or plasma operation that removes a portion of the hard mask 13 exposed through the patterned photoresist layer 15'.

Figure 6:
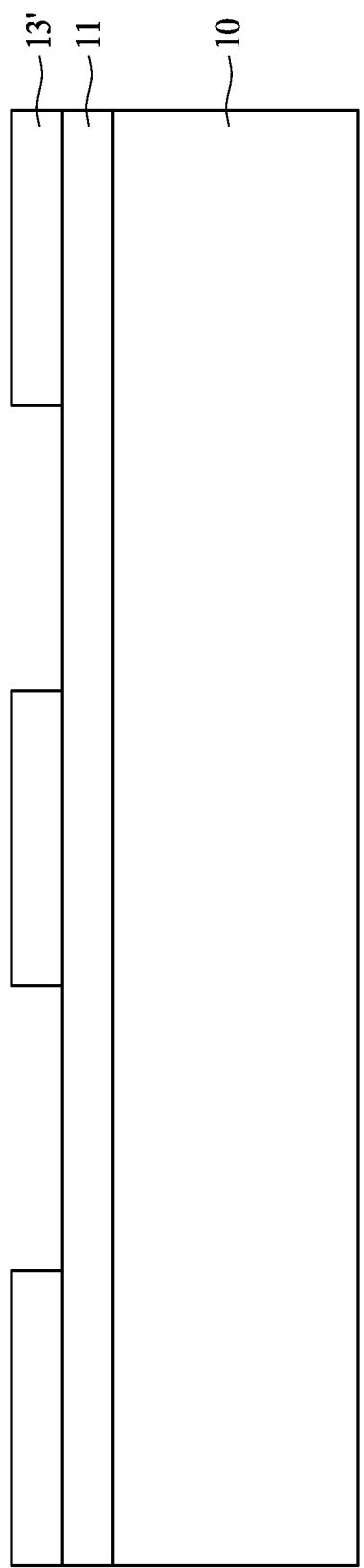

Referring to FIG. 6, in accordance with the operation (O14) and some embodiments of the present disclosure, the patterned photoresist layer 15' is removed. In some embodiments, in accordance with the operation (O14-1) of FIG. 2, an operation is performed to oxidize organic materials attached over the substrate 10, the target layer 11, and the patterned hard mask 13', in order to remove the organic contaminants. The organic materials or organic contaminants referred to herein can be any organic compounds left behind from the previous operations. In some embodiments, ozonated deionized water (deionized water mixed with ozone, or hereinafter $DIO_3$) is provided by nozzle spraying to oxidize the organic materials. In some embodiments, $DIO_3$ is illuminated by a radiation source (e.g., a source providing near-ultraviolet or ultraviolet light) before being sprayed onto the substrate 10. For clarity, the $DIO_3$ that flows through the radiation source or through an ultraviolet lamp is referred to as radiated $DIO_3$ or UV-exposed $DIO_3$. The radiation source provides energy, and the radiated $DIO_3$ or the UV-exposed $DIO_3$ contains neutral and/or charged oxygen radicals ($O^*$, $O^-$ and $O^+$). Use of the radiated $DIO_3$ or the UV-exposed $DIO_3$ has the advantage of oxidizing the organic materials, which enhances removal of the organic contaminants. In some embodiments, the $DIO_3$ and the radiated $DIO_3$ are provided in sequence. In some embodiments, the $DIO_3$ is applied onto the substrate 10 to uniformly oxidize the organic materials by spinning the substrate 10. In some embodiments, the radiated $DIO_3$ or UV-exposed $DIO_3$ is applied onto the substrate 10 to uniformly oxidize the organic materials by spinning the substrate 10.

In some embodiments, a DI water rinsing operation is performed after the oxidizing operation and prior to the operation (O14-2), as will be discussed below.

In some embodiments, in accordance with the operation (O14-2) of FIG. 2, an alkaline solution is applied onto the patterned photoresist layer 15'. In some embodiments, the alkaline solution includes ammonium hydroxide ($NH_4OH$), sodium hydroxide (NaOH), potassium hydroxide (KOH), lithium hydroxide (LiOH), amine, or a combination thereof. In some embodiments, the alkaline solution includes quaternary ammonium salt. In some embodiments, the alkaline solution includes tetramethylammonium hydroxide (TMAH). In some embodiments, the alkaline solution includes deionized water and/or weak acid to adjust a pH value of the alkaline solution. The pH value of the alkaline solution can be adjusted depending on different materials of the underlying layers (i.e., the substrate 10, the target layer 11 and the patterned hard mask 13' in the embodiments) of different applications.

In some embodiments, different alkaline solutions are applied onto the patterned photoresist layer 15' in sequence, e.g., by nozzle spraying. In some embodiments, a combination of different alkaline solutions is applied onto the patterned photoresist layer 15'. In some embodiments, TMAH is applied to the patterned photoresist layer 15' and an SC1 solution is applied to the patterned photoresist layer 15', wherein the SC1 solution is a mixture of ammonium hydroxide ($NH_4OH$), hydrogen peroxide ($H_2O_2$) and deionized water. In some embodiments, the TMAH is provided prior to applying the SC1 solution. In some embodiments, the SC1 solution is provided prior to applying the TMAH. In some embodiments, the TMAH and the SC1 solution are provided in sequence. In some embodiments, a deionized water rinsing operation is performed between the operations of applying the TMAH and applying the SC1 solution.

In some embodiments, the alkaline solution alters molecular bonding of the polymeric patterned photoresist layer 15'. For instance, the TMAH alters the molecular bonding of the polymeric materials by breaking crosslinked polymer chains of the patterned photoresist layer 15'. A structure of the patterned photoresist layer 15' is loosened by the alkaline solution, and the patterned photoresist layer 15' becomes softer. A bonding strength between the patterned photoresist layer 15' and the patterned hard mask 13' is decreased. As a result, the patterned photoresist layer 15' is more easily removed by the following operations. In some embodiments, during the performing of the operation (O14-2), the substrate 10 and the patterned photoresist layer 15' are spun, in order to enhance uniformity of the reaction between the patterned photoresist layer 15' and the alkaline solution. The spinning of the substrate 10 can provide additional benefit in the form of an increased rate of uncrosslinking reaction by providing mechanical forces to enhance electron repulsion between the charged chemical groups in the alkaline solution and the crosslinked polymer chains.

In some embodiments, in accordance with the operation (O14-3) of FIG. 2, mechanical impact is applied to the patterned photoresist layer 15'. In some embodiments, the substrate 10 is subjected to a megasonic cleaning in deionized water including hydrogen bubbles (referred to as $DIH_2$).

Since the structure of the patterned photoresist layer 15' is loosened by the alkaline solution, the patterned photoresist layer 15' attached to the patterned hard mask 13' is softened, and a bonding strength between the patterned photoresist layer 15' and the patterned hard mask 13' is reduced. The patterned photoresist layer 15' is removed by mechanical force applied to the substrate 10. In some embodiments, during the application of the megasonic cleaning to the substrate 10, the substrate 10 is spun in order to enhance uniformity of the mechanical impact on the substrate 10.

In some embodiments, the substrate 10 is subjected to a nozzle-sprayed $DIO_3$ cleaning in order to provide mechanical force to remove the patterned photoresist layer 15'. In some embodiments, during the application of the nozzle-sprayed $DIO_3$ cleaning on the substrate 10, the substrate 10 is spun in order to enhance uniformity of the mechanical impact on the substrate 10.

In some embodiments, a deionized water rinsing is performed on the substrate 10 prior to applying the alkaline solution. In some embodiments, the deionized water rinsing is performed on the substrate 10 after the operation (O14-1). The deionized water is applied to remove reactants from previous operations. In some embodiments, ions of the reacted organic material from the previous operations (e.g., oxygen radicals from radiated $DIO_3$), and/or electrical charges accumulated on the substrate 10, are removed by the deionized water rinsing. In some embodiments, a rate and efficiency of the reaction between the alkaline solution and the patterned photoresist layer 15' are enhanced by the removal of the reactants from the substrate 10 during the previous operations, and thus the alkaline solution is able to more easily react with the patterned photoresist layer 15'. In some embodiments, the substrate 10 is spun while the deionized water is applied to the substrate 10.

In some embodiments, a deionized water rinsing is performed on the substrate 10 after the operation (O14-3). The deionized water rinsing helps to remove ionic residues from the substrate 10 to enhance accuracy of the subsequent operations that form a photomask. In some embodiments, the substrate 10 is spun while the deionized water is applied to the substrate 10.

Figure 7:
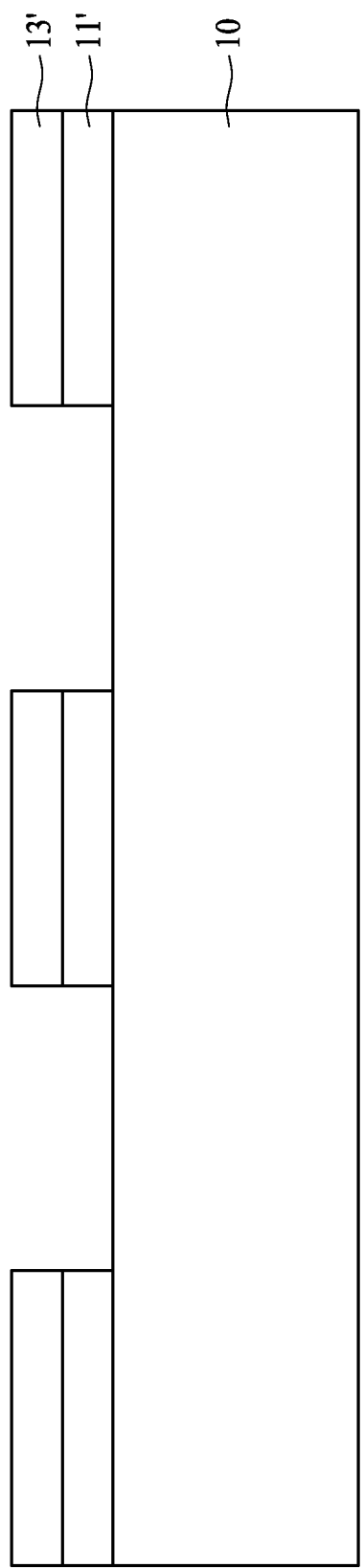

Referring to FIG. 7, in accordance with some embodiments of the present disclosure, the method M10 further includes patterning the target layer 11 using the patterned hard mask 13' as a mask. The target layer 11 is disposed between the substrate 10 and the patterned hard mask 13'. A portion of the target layer 11 exposed through the patterned hard mask 13' is removed to form a patterned target layer 11'. In some embodiments, the patterned target layer 11' is formed by dry etching.

Figure 8:
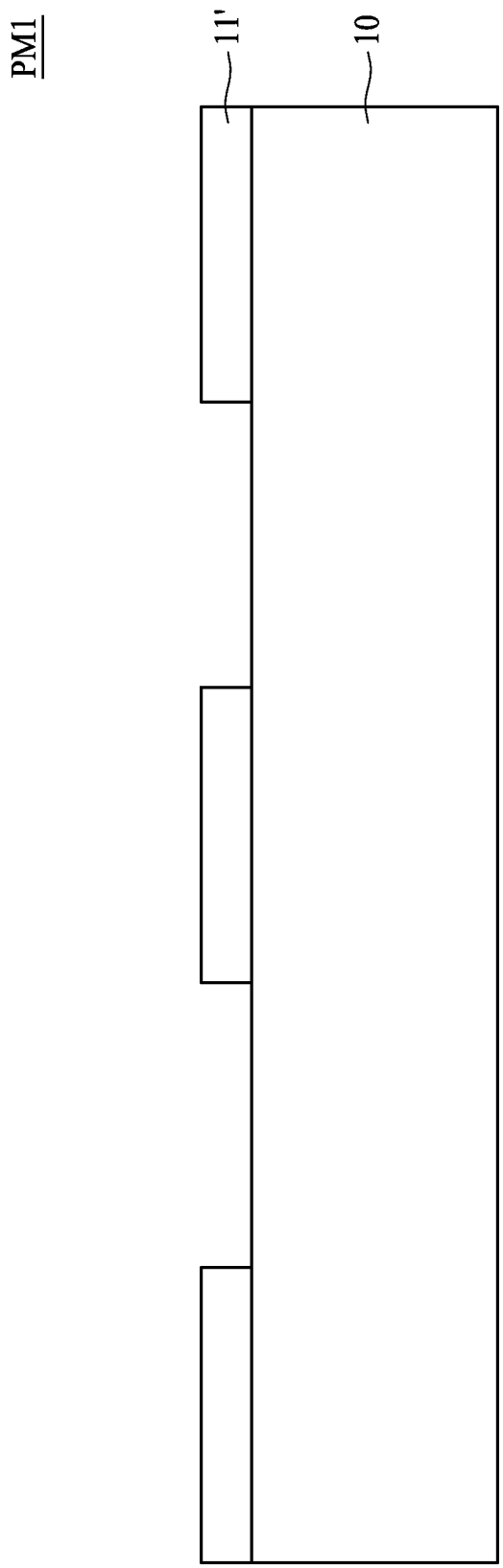

Referring to FIG. 8, in accordance with some embodiments of the present disclosure, the method M10 further includes removing the patterned hard mask 13' from the substrate 10. The patterned hard mask 13' is removed after formation of the patterned target layer 11' over the substrate 10 to form a photomask PM1, as shown in FIG. 8. In some embodiments, a cleaning operation, e.g., a RCA clean (a well-known cleaning procedure in the art developed by Werner Kern in 1965), a RCA-1 clean (or called "standard clean-1", SC1, which is a well-known sub-cleaning operation of an organic clean in the RCA clean), a RCA-2 clean (or called "standard clean-2", SC2, which is a well-known sub-cleaning operation of an ionic clean in the RCA clean) or a deionized water rinsing, is optionally performed prior to and/or after the removal of the patterned hard mask 13'.

Figure 8B:
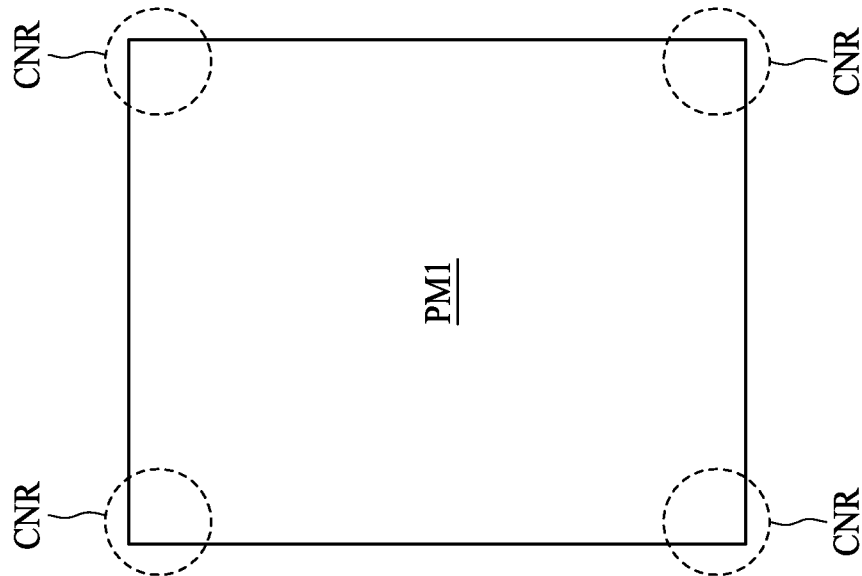
FIG. 8B is a top view showing no photoresist residues remaining at the corners of the photomask, in accordance with one embodiment of the present disclosure.
Figure 8A:
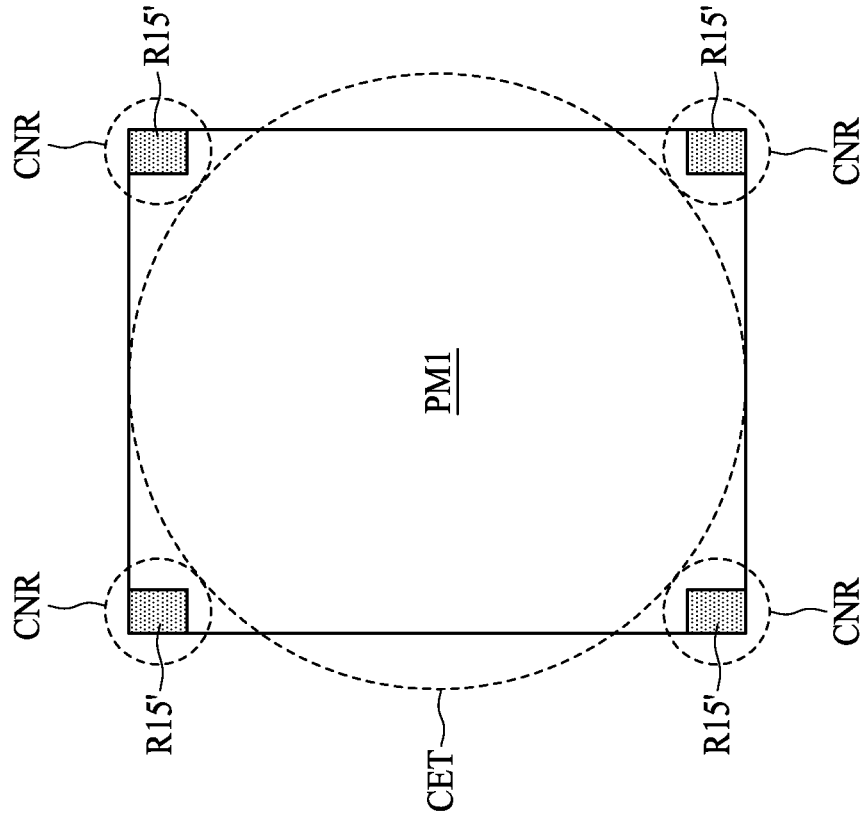
FIG. 8A is a top view showing photoresist residues remaining at the corners of the photomask, in accordance with one comparative embodiment of the present disclosure.

The embodiments, as provided above and in FIGS. 3 to 8 in accordance with the method M10 shown in FIG. 1, can efficiently remove the photoresist(s) used in the manufacturing of a photomask. A percentage of defect occurred on a photomask can be controlled in a range of 0% to 1.5%. As shown in FIG. 8A, after photoresist removal operation, at least omitting the operation (O14-2) of the method M10, is applied, residues R15' of the patterned photoresist layer 15' remain at the corners CNR of the photomask PM1 due to the fact that those residues R15' are more difficult to be removed than portions of the patterned photoresist layer 15' at the center region CET. As shown in FIG. 8B, after photoresist removal operation, as previously described in FIG. 6, is applied, the photoresist can be effectively removed without showing residues at the corner CNR of the photomask PM1. Moreover, the alkaline solution utilized in operation (O14-2) has negligible effect to the critical dimension (CD) of the pattern of the photomask PM1. In other words, CD measurement result, including CD mean value and CD uniformity, on the photomask pattern prepared by current cleaning operation (i.e. the operation O14 illustrated in FIG. 2) is comparable to the CD measurement result using conventional cleaning operation.

In accordance with some embodiments of the present disclosure, a method M11 for manufacturing a photomask is provided, wherein the method M11 can be an alternate method derived from the method M10. In some embodiments, the operation (O12) of the method M10 further includes forming a first patterned photoresist layer in operation O121 of method M11 and forming a second photoresist layer in operation O122 of method M11. In some embodiments, the operation (O13) of the method M10 further includes patterning the hard mask layer twice using the first patterned photoresist layer and the second photoresist layer, as will be described in operation O131 and operation O132 of method M11, respectively. In some embodiments, the operation (O14) of method M10 further includes removing the first patterned photoresist layer and the second photoresist layer, as will be described in operation O141 and operation O142 of method M11, respectively. In some embodiments, the hard mask 13 can be a single-layered structure. In some embodiments, the hard mask 13 can be a multi-layered structure.

Figure 9:
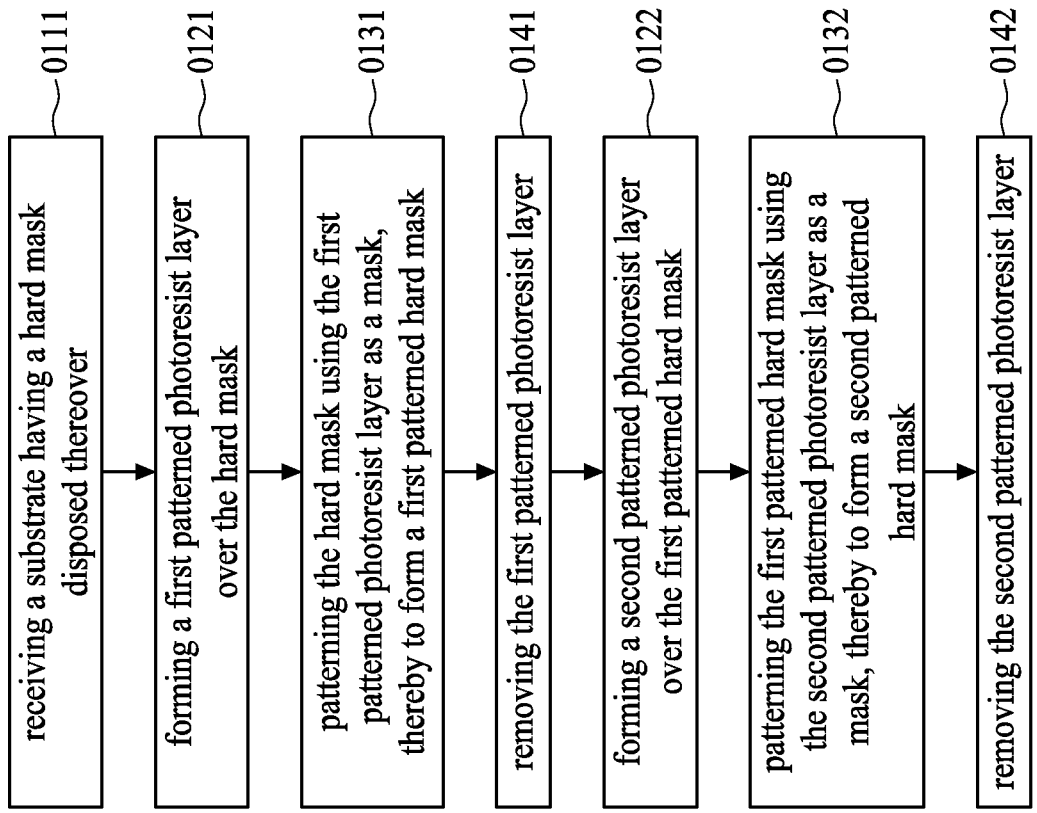
FIG. 9 is a flowchart of various steps of a method for manufacturing a photomask in accordance with some embodiments of the present disclosure.

Referring to FIG. 9, the method M11 includes: (O111) receiving a substrate having a hard mask disposed thereover; (O121) forming a first patterned photoresist layer over the hard mask; (O131) patterning the hard mask using the first patterned photoresist layer as a mask, thereby forming a first patterned hard mask; (O141) removing the first patterned photoresist layer; (O122) forming a second patterned photoresist layer over the first patterned hard mask; (O132) patterning the first patterned hard mask using the second patterned photoresist layer as a mask, thereby forming a second patterned hard mask; and (O142) removing the second patterned photoresist layer.

To further illustrate concepts of the present disclosure, FIGS. 9 to 20 are provided in accordance with some embodiments for purposes of ease of understanding, but are not intended to limit the present disclosure. Reference numerals are repeated to indicate the elements having same or similar functions or properties for ease of understanding.

Figure 10:
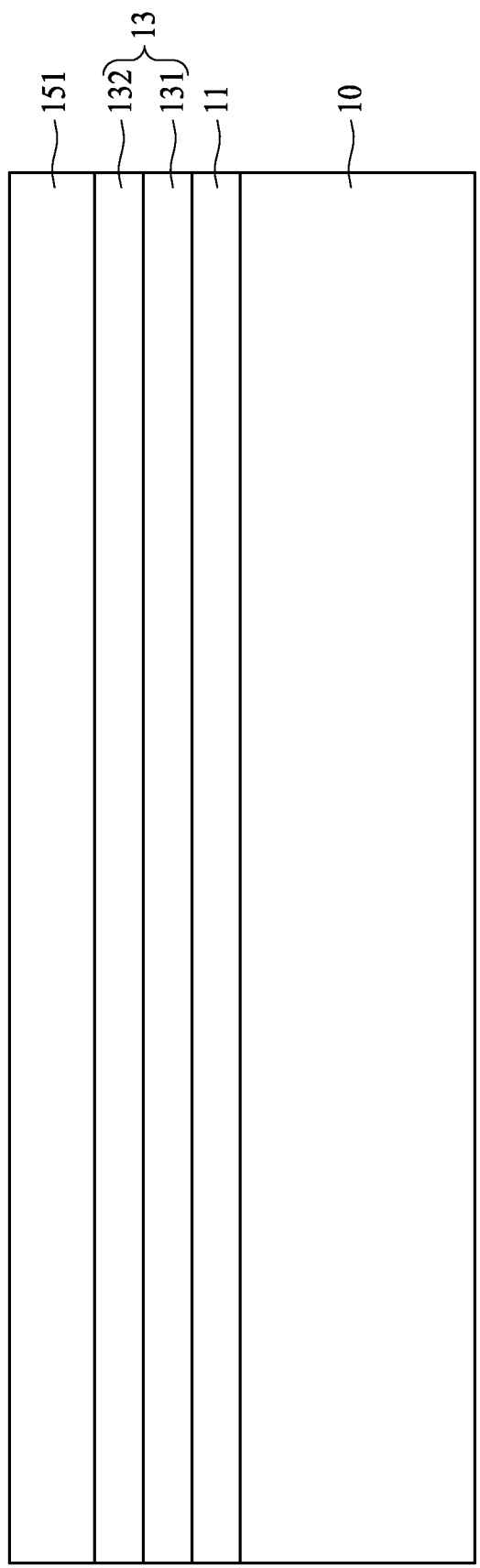
FIGS. 10 to 20 are cross-sectional views of one or more operations of a method for forming a photomask in accordance with some embodiments of the present disclosure.

Referring to FIG. 10, in accordance with the operation (O111) and some embodiments of the present disclosure, a substrate 10 is received. A target layer 11, a hard mask 13 and a photoresist layer 151 are formed in sequence on the substrate 10. In some embodiments, the hard mask 13 includes a hard mask layer 131 and a sacrificial hard layer 132 formed in sequence on the target layer 11 over the substrate 10, as shown in FIG. 10. The sacrificial hard layer 132 is designed to provide accuracy of patterning the hard mask layer 131. The sacrificial hard layer 132 includes materials having a high etch selectivity to the hard mask layer 131 to a predetermined etchant. In some embodiments, the material of the hard mask layer 131 includes metal, e.g. chromium, and a material of the sacrificial hard layer 132 includes oxide, nitride, or other suitable materials.

Figure 11:
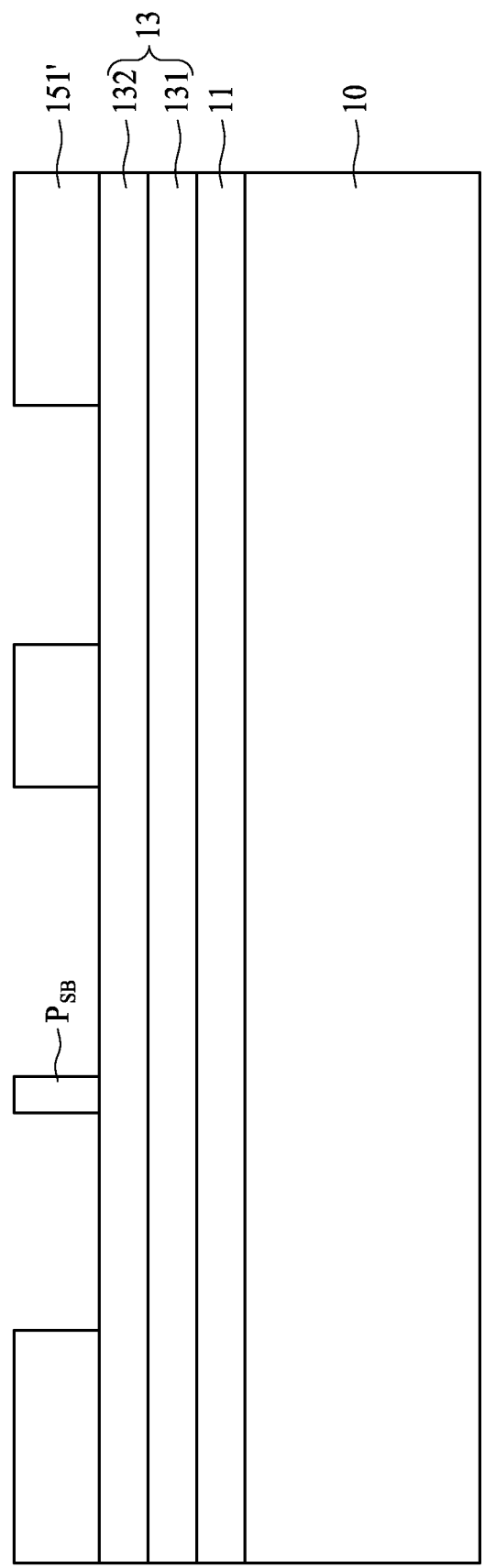

In accordance with the operation (O121) and some embodiments of the present disclosure, the photoresist layer 151 is patterned to form a patterned photoresist layer 151' as shown in FIG. 11. Formation of the patterned photoresist layer 151' can be similar to the formation of the patterned photoresist layer 15'. Materials of the photoresist layer 151 can be similar to materials of the photoresist 15. Materials and formation of the target layer 11 and the substrate 10 can be similar to those of the target layer 11 and the substrate 10 illustrated above in other embodiments. Repeated descriptions are omitted herein.

In some embodiments, the photoresist layer 151 is a negative photoresist. A polymerization is induced by light after the exposure operation. In some embodiments, the photoresist layer 151 is a positive photoresist. The patterned photoresist layer 151' includes crosslinked polymer chains.

Figure 12:
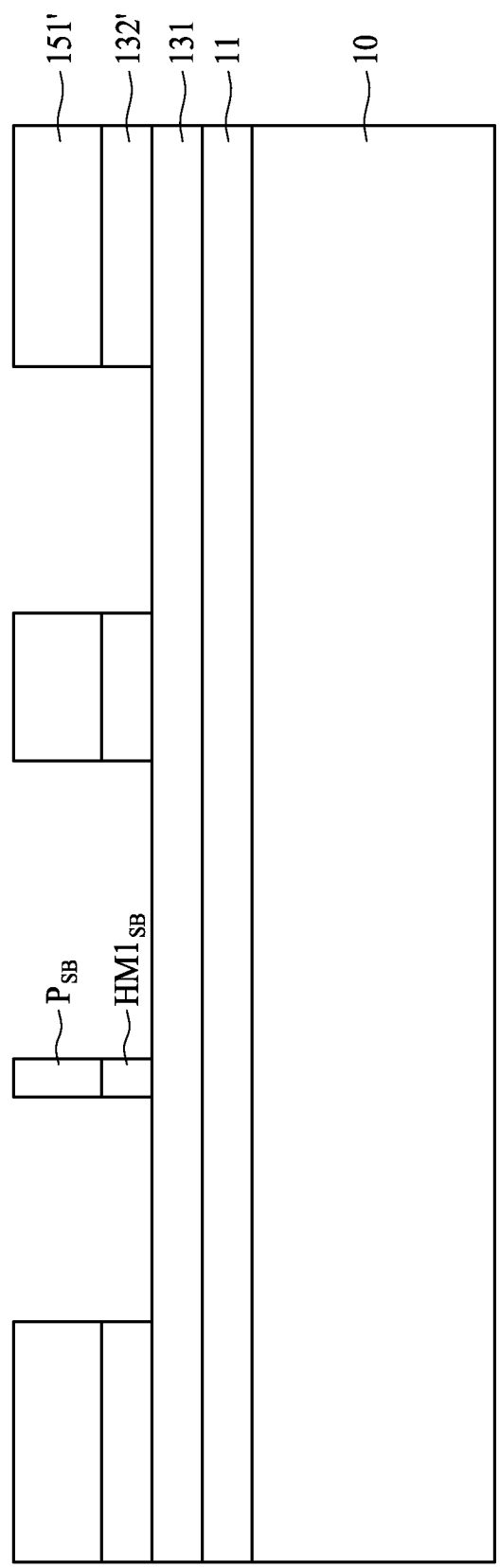
Figure 13:
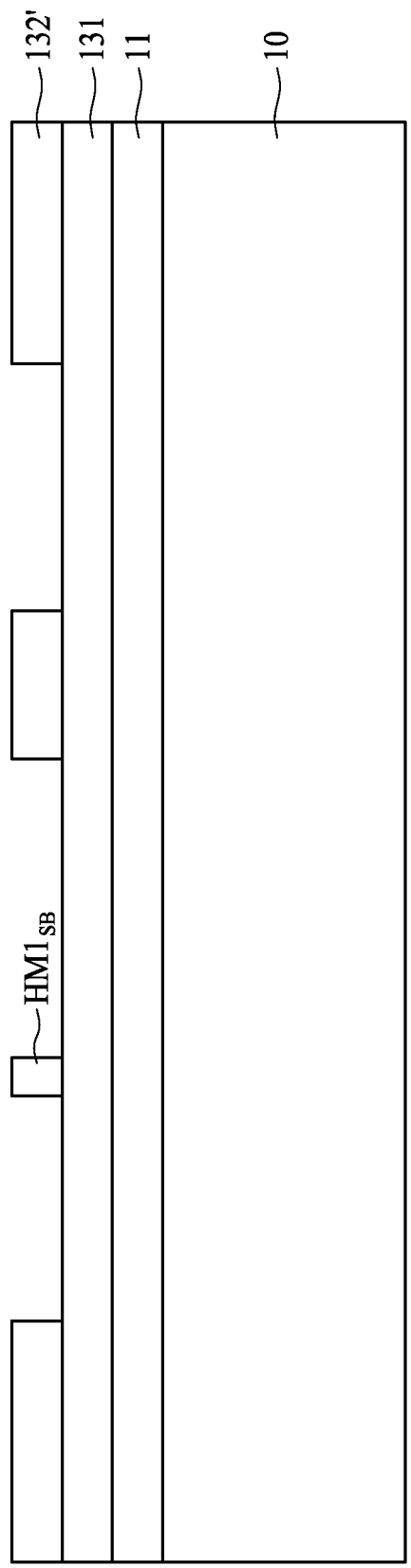
Figure 14:
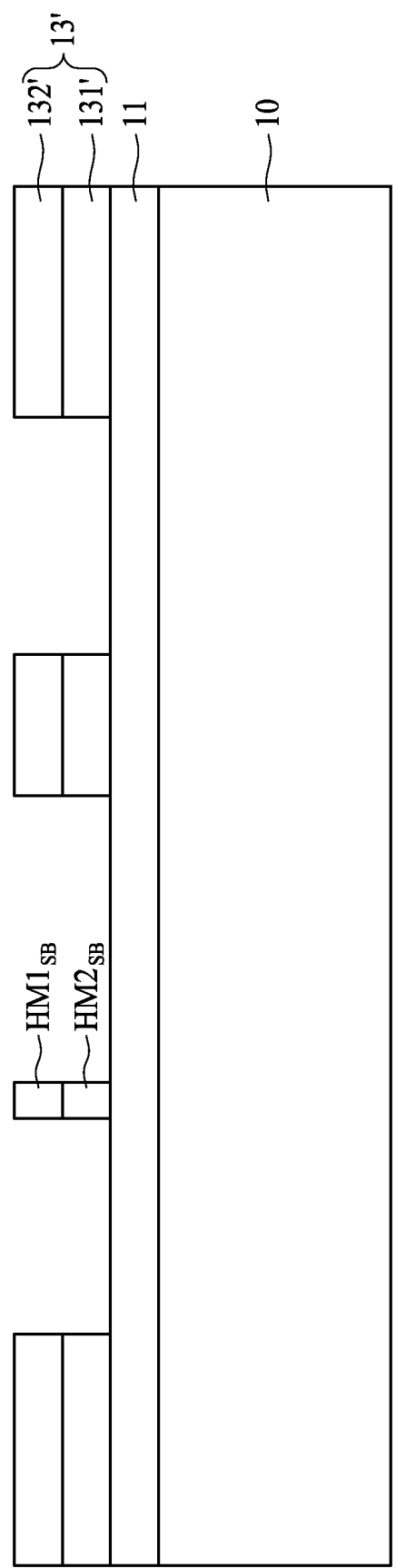

Referring to FIGS. 12 to 14, in accordance with the operations (O131) and (O132) and some embodiments of the present disclosure, the sacrificial hard layer 132 of the hard mask 13 is patterned and the patterned photoresist layer 151' is removed. In those embodiments in which the hard mask layer 131 and the sacrificial hard layer 132 are formed, the sacrificial hard layer 132 is patterned using the patterned photoresist layer 151' as a mask. A portion of the sacrificial hard layer 132 exposed through the patterned photoresist layer 151' is removed, e.g. by an etching operation, to form a patterned sacrificial hard layer 132' as shown in FIG. 12 over the hard mask layer 131.

Referring to FIG. 13, in accordance with the operation (O141) and some embodiments of the present disclosure, the patterned photoresist layer 151' is removed. In some embodiments, the operation (O141) includes the operations (O14-1) to (O14-3) as shown in FIG. 2. In some embodiments, in accordance with the operation (O14-1), an operation is performed to oxidize organic materials attached over the substrate 10, the target layer 11, hard mask layer 131, and the patterned sacrificial hard layer 132', in order to remove the organic materials. The organic materials or organic contaminants referred to herein can be any organic compounds left behind from the previous operations. In some embodiments, $DIO_3$ is provided to the substrate 10 by nozzle spraying to oxidize the organic contaminants. In some embodiments, radiated $DIO_3$ or UV-exposed $DIO_3$ is applied, and neutral and/or charged oxygen radicals ($O^*$, $O^-$ and $O^+$) contained in the radiated $DIO_3$ or the UV-exposed $DIO_3$ react with the organic materials, and thereby oxidize the organic contaminants. In some embodiments, the $DIO_3$ and the radiated $DIO_3$ are provided sequentially, with the $DIO_3$ provided first and the radiated $DIO_3$ provided second, or vice versa. In some embodiments, the substrate 10 is spun while the $DIO_3$ is applied to the substrate 10. In some embodiments, the substrate 10 is spun while the radiated $DIO_3$ or the UV-exposed $DIO_3$ is applied to the substrate 10. The use of spinning the substrate 10 in the operation (O14-1) can enhance uniformity of the oxidizing operation.

In some embodiments, a DI water rinsing operation is performed after the oxidizing operation and prior to the operation (O14-2), as will be discussed below.

In some embodiments, in accordance with the operation (O14-2) of FIG. 2, an alkaline solution is applied to the patterned photoresist layer 151'. In some embodiments, the alkaline solution includes ammonium hydroxide (NH$_4$OH), sodium hydroxide (NaOH), potassium hydroxide (KOH), lithium hydroxide (LiOH), amine, or a combination thereof. In some embodiments, the alkaline solution includes quaternary ammonium salt. In some embodiments, the alkaline solution includes tetramethylammonium hydroxide (TMAH). Other cleaning or rinsing operations and/or sub-operations can be optionally performed as illustrated above in the method M10.

In some embodiments, in accordance with the operation (O14-3) of FIG. 2, mechanical impact is applied to the patterned photoresist layer 151'. The mechanical impact can be provided by means including, but not limited to, a megasonic cleaning of DIH$_2$, nozzle spraying (of deionized water, DIH$_2$, DIO$_3$, radiated DIO$_3$ and/or UV-exposed DIO$_3$). The patterned photoresist layer 151' is removed by mechanical force.

As previously discussed, a first deionized water rinsing is performed on the substrate 10 prior to application of the alkaline solution. In some embodiments, a second deionized water rinsing is performed on the substrate 10 after the removal of the patterned photoresist layer 151' by mechanical impact. The deionized water rinsing helps to remove ionic residues and/or reactants from the substrate 10 to enhance accuracy of the subsequent operations that form a photomask. In some embodiments, when the first deionized water rinsing is applied to the substrate 10, the substrate 10 is spun. In some embodiments, when the second deionized water rinsing is applied to the substrate 10, the substrate 10 is spun.

Figure 15:
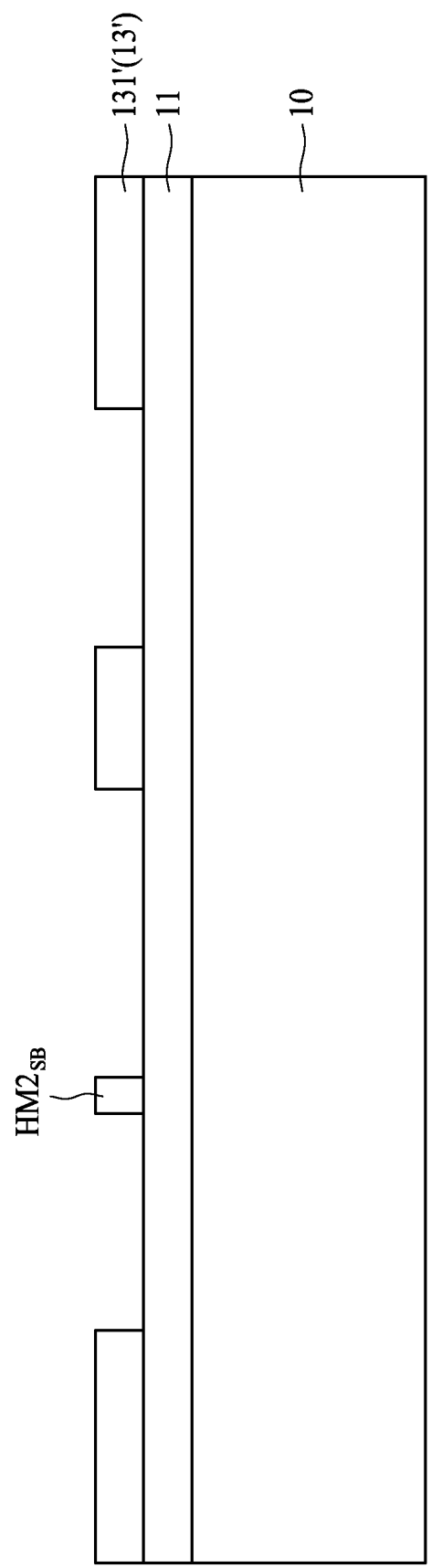

Referring to FIG. 14, in accordance with some embodiments of the present disclosure, the hard mask layer 131 is patterned using the patterned sacrificial hard layer 132' as a mask. A portion of the hard mask layer 131 exposed through the patterned sacrificial hard layer 132' is removed, e.g. by one or more etching operations. In some embodiments, the patterned sacrificial hard layer 132' is removed from the substrate 10 as shown in FIG. 15. The pattern of the patterned photoresist layer 151' is transferred onto the hard mask 13 (shown in FIG. 11), and a patterned hard mask 13' is thereby formed. The patterned hard mask 13' in such embodiments includes the patterned hard mask layer 131', and optionally the patterned sacrificial hard layer 132'.

Figure 16:
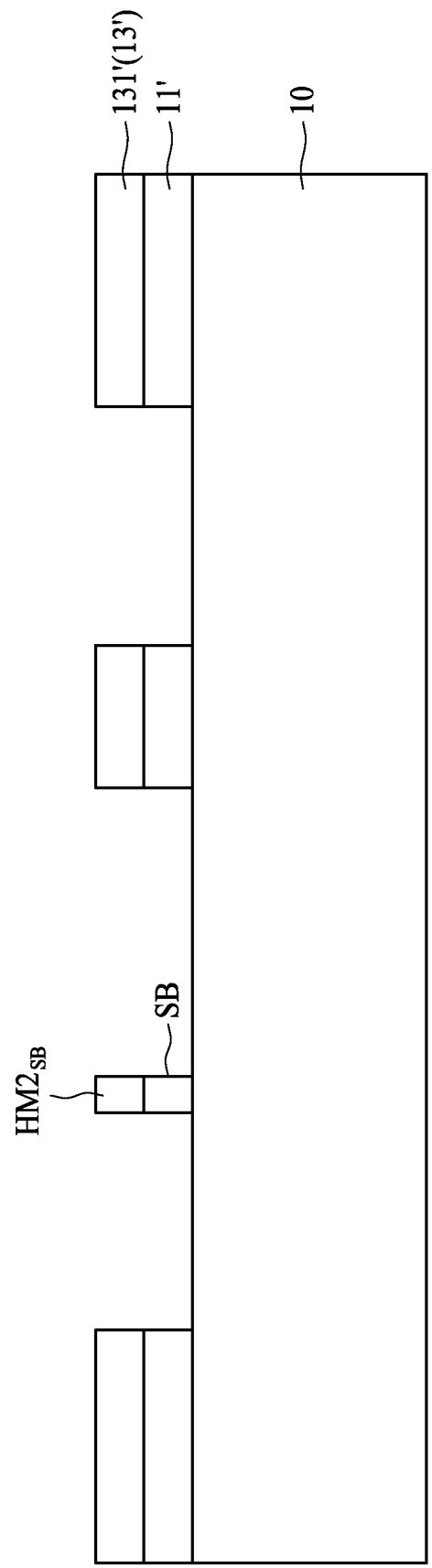

Referring to FIG. 16, in accordance with some embodiments, the method M11 further includes patterning the target layer 11 using the patterned hard mask layer 131' as a mask. A portion of the target layer 11 exposed through the patterned hard mask layer 131' is removed to form a patterned target layer 11'. The pattern of the patterned hard mask layer 131' is transferred onto the target layer 11. In some embodiments, a cleaning operation, e.g. a standard cleaning operation or a deionized water rinsing, is optionally performed prior to and/or after the patterning of the target layer 11.

Figure 17:
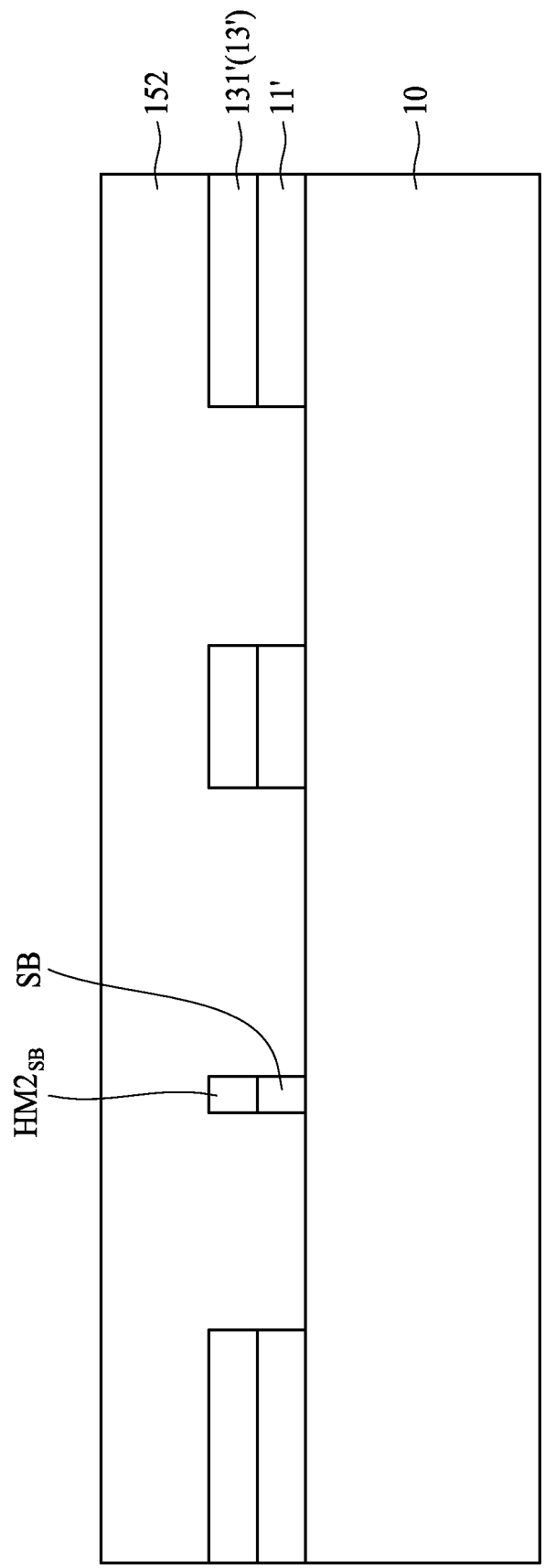
Figure 18:
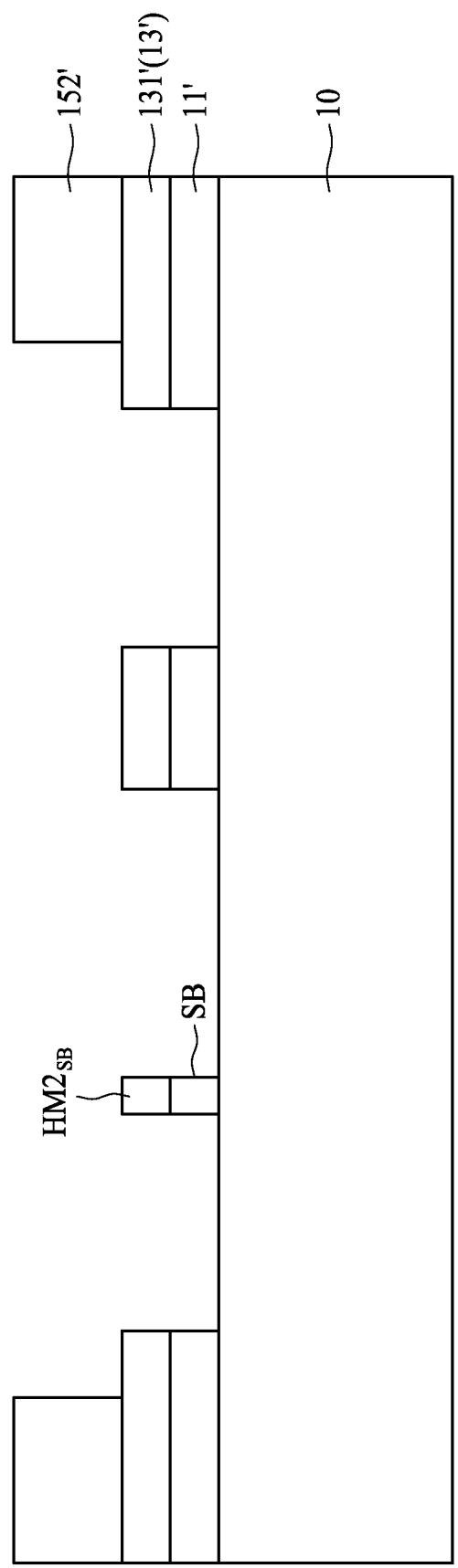

Referring to FIGS. 17 to 18, in accordance with the operation (O122) and some embodiments of the present disclosure, a patterned photoresist layer 152' is formed over the patterned hard mask layer 131'. A photoresist layer 152 is formed over the substrate 10 covering the patterned hard mask layer 131', and a portion of the photoresist layer 152 is removed to form the patterned photoresist layer 152'. In some embodiments, the photoresist layer 152 is a negative photoresist, and in other embodiments, the photoresist layer 152 is a positive photoresist. In some embodiments, the photoresist layer 152 is the same type of photoresist (e.g. negative photoresist) as the photoresist layer 151.

Figure 19:
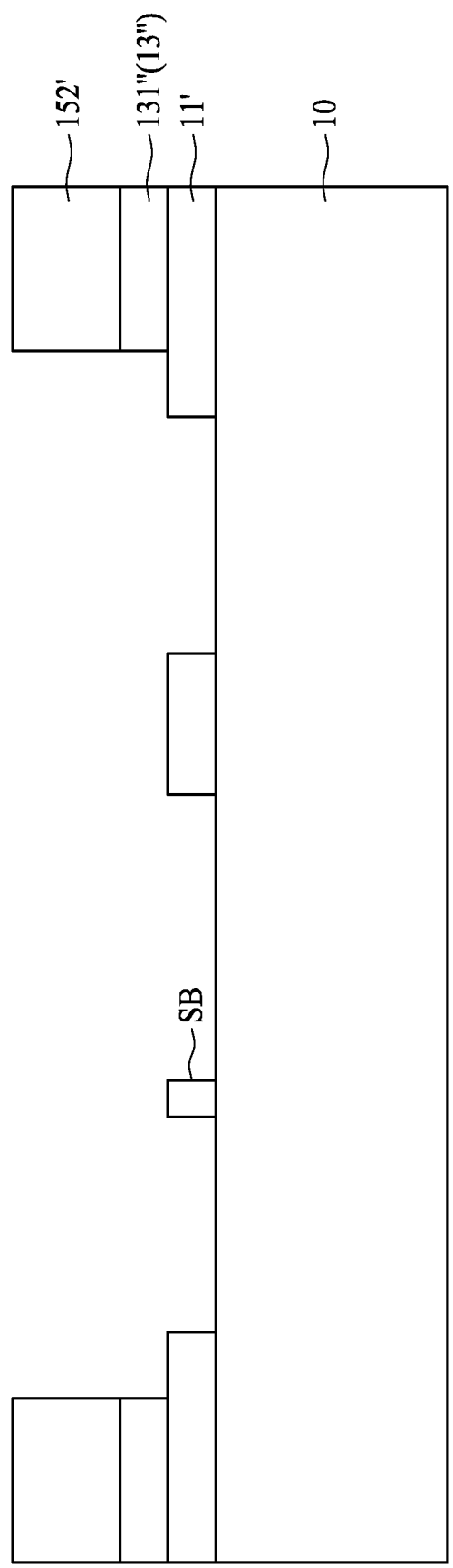

Referring to FIG. 19, in accordance with the operation (O132) and some embodiments of the present disclosure, the patterned hard mask layer 131' is patterned using the patterned photoresist layer 152' as a mask to form a patterned hard mask layer 131". A portion of the patterned hard mask layer 131' exposed through the patterned photoresist layer 152' is removed. The hard mask 13 (shown in FIG. 11) is patterned twice to form a patterned hard mask 13". In such embodiments, the patterned hard mask 13" includes the patterned hard mask layer 131".

Figure 20:
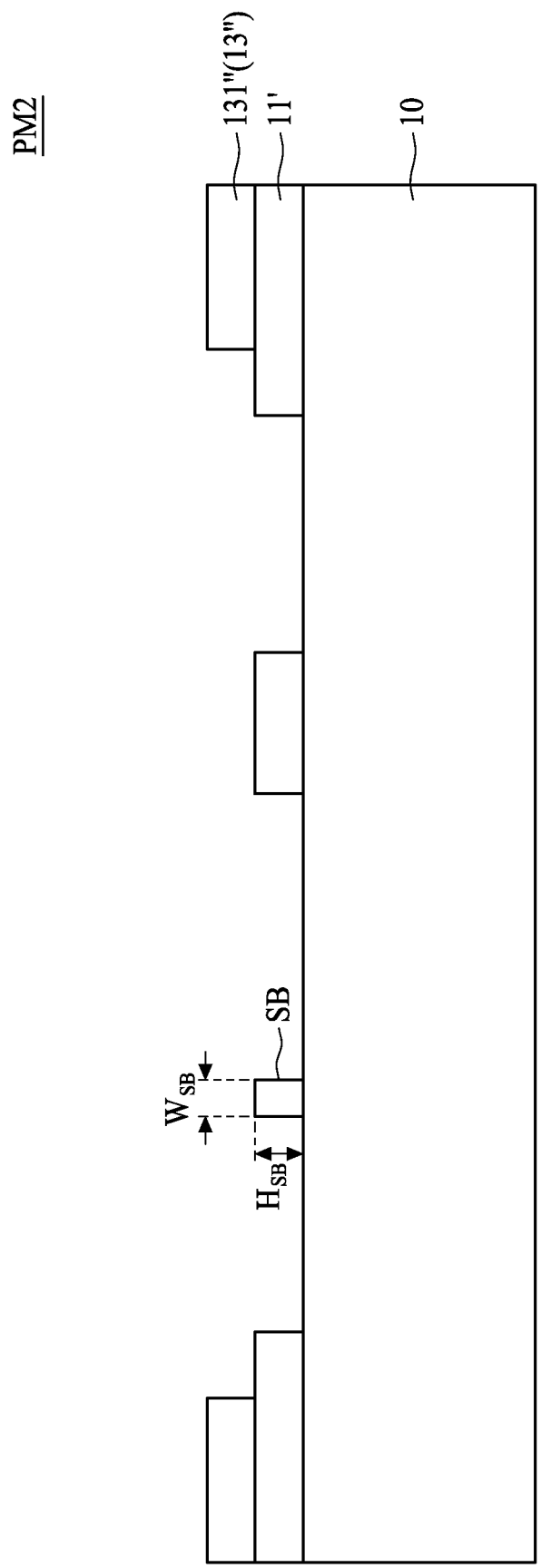

Referring to FIG. 20, in accordance with the operation (O142) and some embodiments of the present disclosure, the patterned photoresist layer 152' is removed. In some embodiments, the operation (O141) includes the operations (O14-1) to (O14-3) as shown in FIG. 2. Repeated description is omitted herein. The patterned hard mask 131" is left in place on the patterned target layer 11' over the substrate 10 to form a photomask PM2. In some embodiments, the patterned mask 131" serves as a light-shielding layer of a halftone phase shift photomask.

As in advanced manufacturing and for higher resolution, assistant features such as scattering bars, which are sub-resolution lines placed adjacent to resolvable lines, are designed to be formed on the photomask PM2, as illustrated in FIG. 20 of present disclosure, for prevention of exposure distortion and resolution enhancement. Referring back to FIG. 12 and FIG. 20, in the embodiments a negative photoresist 151 is used, a portion $P_{SB}$ of the patterned photoresist layer 151' in FIG. 11 is for formation of a scattering bar SB in FIG. 20. The assistant features, or the scattering bar SB in the embodiments on the photomask PM2, is non-printable on a surface of a semiconductor wafer or a semiconductor substrate. For the above purposes, the scattering bar SB has a high height-to-width aspect ratio (i.e. $H_{SB}/W_{SB}$). As shown in FIG. 20, a height $H_{SB}$ of the scattering bar SB is in a range of from 50 to 100 nanometers, and a width $W_{SB}$ of the scattering bar SB is in a range of from 5 to 30 nanometers. In formation of the scattering bar SB, a portion $HM1_{SB}$ of the patterned sacrificial hard layer 132' and a portion $HM2_{SB}$ of the patterned hard mask layer 131' are sequentially formed as shown in FIGS. 12 to 16. In some embodiments, the portion $HM1_{SB}$ and the portion $HM2_{SB}$ have a high height-to-width aspect ratio as well. The portion $HM1_{SB}$ and the scattering bar SB are prone to be removed due to the high height-to-width aspect ratios when removing the patterned photoresists 151' and 152' respectively during the conventional photoresist cleaning recipe. Alternatively stated, conventional photoresist cleaning recipe exerted too much mechanical impact such as cleaning fluid on the high aspect ratio features such as patterned hard mask for scattering bars and the corresponding scattering bars per se, rendering loss of the high aspect ratio feature during the cleaning operations. The alkaline solution discussed in the aforesaid cleaning recipe and in the method M11 provides chemical forces to remove the patterned photoresists 151' and 152' and avoid peeling of the portion $HM1_{SB}$ and the scattering bar SB. In some embodiments, a peeling percentage of the scattering bars SB can be controlled less than 5%.

Figure 21:
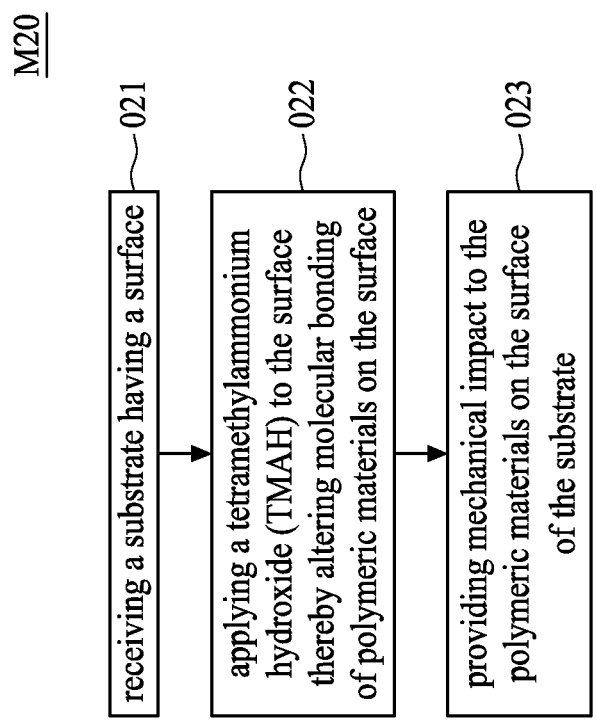
FIG. 21 is a flowchart of various steps of method for cleaning a substrate in accordance with some embodiments of the present disclosure.
Figure 22:
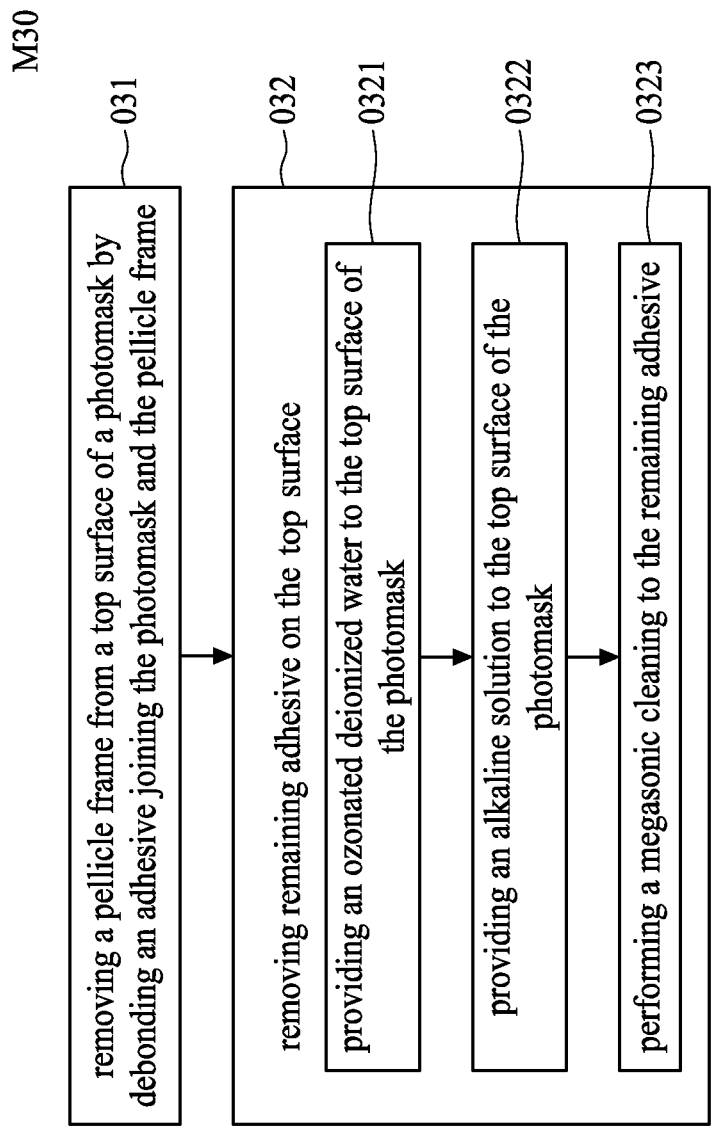
FIG. 22 is a flowchart of various steps of method for cleaning a photomask in accordance with some embodiments of the present disclosure.

The present disclosure provides a method for manufacturing a photomask. The method includes a series of operations to remove the photoresist by altering molecular bonding of the polymers. Under the same concept, the present disclosure also provides a method M20 for cleaning a substrate as shown in FIG. 21, and a method M30 for cleaning a photomask as shown in FIG. 22.

The method M20 includes: (O21) receiving the substrate having a surface; (O22) applying a tetramethylammonium hydroxide (TMAH) to the first surface, thereby altering molecular bonding of polymeric materials on the surface; and (O23) providing mechanical impact to the surface of the substrate. The method M20 performs removal of the polymeric materials on the surface of the substrate. In accordance with some embodiments and the method M20 as shown in FIG. 21, the substrate can be any kind of substrate used in a semiconductor manufacturing process. In some embodiments, the substrate is an intermediate photomask substrate as illustrated in accordance with the method M10 and the method M11. In some embodiments, the substrate is a final photomask to be used in a semiconductor manufacturing process. During a semiconductor manufacturing process, polymeric materials or remaining adhesives are attached to the surface of the substrate, and the method M20 can be applied to any operation during the semiconductor manufacturing process in order to remove the polymeric materials or remaining adhesives by altering molecular bonding therebetween. The method M30 can further include other cleaning or rinsing operations or sub-operations as illustrated in accordance with the method M10 and the method M11. Repeated description is omitted herein.

When a photomask mounted with pellicle is contaminated or illuminated for a long period, the pellicle is required to be replaced or cleaned. A clean and inspection operation will be conducted subsequently after the pellicle being removed by the pellicle cutter and de-mounting machine in order to make sure the eradication of not only the contaminant but also the adhesives. In some embodiments, a photomask mounted with pellicle includes pellicle itself, frame, frame coating, vent hole and filter, backside cover, and mounting adhesive. Among which the mounting adhesive includes acrylic-based compound, rubber-based compound, polybutene-based compound, polyurethane-based compound, and silicon-based compound. Mounting adhesive is hard to remove because after the long period of illumination, degradation and outgassing in organic adhesive would harden the material due to cross linking reactions. The mounting adhesive residue spread across the pattern of even damages the pattern. The cleaning operations disclosed in present disclosure can used to treat the cross-linked mounting adhesives remaining on the photomask after pellicle removal.

The method M30 includes: (O31) removing a pellicle frame from a top surface of a photomask by debonding an adhesive joining the photomask and the pellicle frame; and (O32) removing remaining adhesive on the top surface, wherein the operation (O32) includes: (O321) providing an ozonated deionized water to the top surface of the photomask; (O322) providing an alkaline solution to the top surface of the photomask; and (O323) performing a megasonic cleaning on the remaining adhesive.

Figure 23:
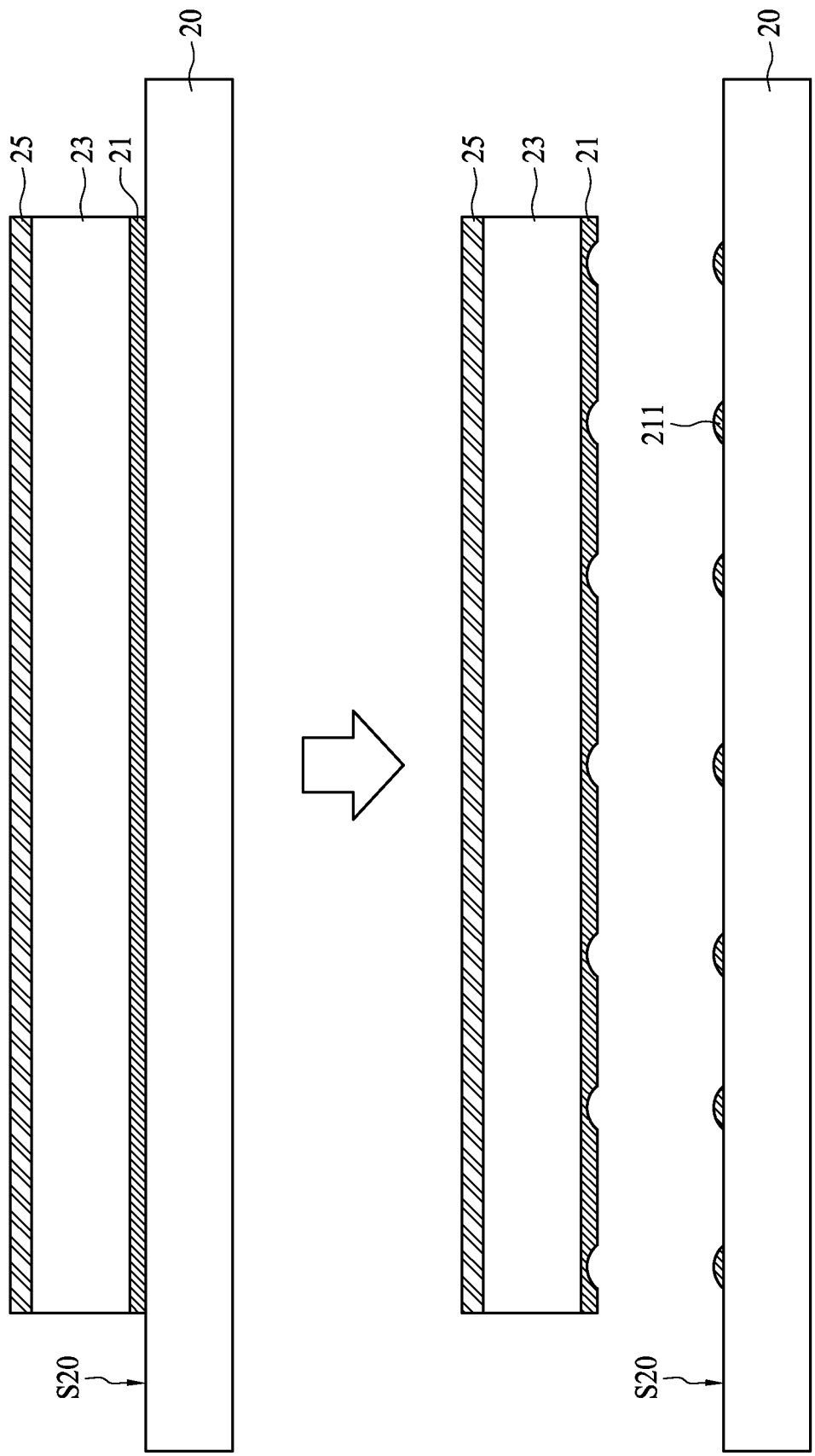
FIG. 23 is cross sectional views showing one or more operations of a method for cleaning a photomask in accordance with some embodiments of the present disclosure.

Referring to FIG. 23, a pellicle frame 23 is fixed on a top surface S20 of a photomask 20 by an adhesive 21. A pellicle 25 is attached on the pellicle frame 23 on a side of the pellicle frame 23 away from the photomask 20 in order to reduce contamination and damage from the environment or during a manufacturing process. Removal of the pellicle frame 23 from the top surface S20 of the photomask 20 is occasionally required for repair, adjustment, or cleaning of the photomask 20. In accordance with the operation (31) and some embodiments of the present disclosure, the pellicle frame 23 is removed from the top surface S20 of the photomask 20 by debonding the adhesive 21 joining the photomask 20 and the pellicle frame 23. As shown in FIG. 23, portions of adhesive remain on the top surface S20 of the photomask 20, which are indicated as adhesive residues 211. Degradation or transformation of the adhesive 21 after a long period of use or after light exposure during the photolithography process results in difficulty of removal of the adhesive 23. In some embodiments, the adhesive 23 includes polymeric materials, and the adhesive residues 211 include crosslinked polymer chains. In accordance with the operation (O32) and some embodiments of the present disclosure, the operations (O321) to (O323) are performed to remove the remaining adhesive residues 211. The operations (O321) to (O323) are similar to the operations (O14-1) to (O14-2) as shown in FIG. 2. Repeated description is omitted herein. Other cleaning or rinsing operations and/or sub-operations before, during, or after the operations (O14-1) to (O14-2) can also be optionally performed in the method M30.

Compare to conventional adhesive cleaning operations, for example, without alkali solution, a clean yield in present embodiments is 98% as opposed to 91% using conventional adhesive cleaning operations. The clean yield is defined as the first successful rate after the pellicle 25 and pellicle frame 23 being remounted to the photomask 20 after adhesive cleaning operation. As such, the adhesive cleaning operation of present embodiments allowing adhesive residues 211 on the photomask 20 to be effectively removed, and thereby limiting damages on the photomask 20 during the removal of the adhesive residues 211.

The present disclosure provides the methods to remove photoresists and/or polymeric materials or contaminants over a substrate. The methods can be applied also in a manufacturing of a semiconductor device. In accordance with some embodiments and the methods of the present disclosure, due to the more effective removal technique by opening the cross-linking structure of the polymeric materials and less physical forces are required in the cleaning operations, a number of defects can be improved by 50%. Moreover, a clean cycle time can be also improved by 24% due to enhanced chemical forces provided by the alkaline solution, and thus the methods of the present disclosure are more effective to the removal of the photoresists, polymeric materials and/or contaminants. In combination of other cleaning operations or sub-operations, a change in critical dimensions of features on a substrate can be well controlled.

Some embodiments of the present disclosure provide a method for cleaning a substrate. The method includes receiving the substrate having a surface; applying a tetramethylammonium hydroxide (TMAH) to the surface, thereby altering molecular bonding of polymeric materials on the surface; and providing mechanical impact to the polymeric materials on the surface of the substrate.

Some embodiments of the present disclosure provide a method for manufacturing a photomask. The method includes: receiving a substrate having a hard mask disposed thereover; forming a patterned photoresist over the hard mask layer; patterning the hard mask using the patterned photoresist as a mask; and removing the patterned photoresist. The removal of the patterned photoresist includes: oxidizing organic materials over substrate; applying an alkaline solution onto the patterned photoresist; and removing the patterned photoresist by mechanical impact.

Some embodiments of the present disclosure provide a method for cleaning a photomask. The method includes: removing a pellicle frame from a top surface of a photomask by debonding an adhesive joining the photomask and the pellicle frame; and removing remaining adhesive from the top surface of the photomask. The removal of the remaining adhesive includes: providing an ozonated deionized water to the top surface of the photomask; providing an alkaline solution to the top surface of the photomask; and performing a megasonic cleaning on the remaining adhesive.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for cleaning, comprising:
    removing a pellicle frame from a top surface of a photomask by debonding an adhesive between the photomask and the pellicle frame, wherein a first portion of the adhesive is remained on the top surface of the photomask; and
    removing the first portion of the adhesive on the top surface of the photomask, comprising:
        applying ozonated deionized water over the top surface of the photomask to oxidize the first portion of the adhesive;
        applying an alkaline solution to the top surface of the photomask after applying the ozonated deionized water; and
        performing a mechanical impact to the photomask.

2. The method of claim 1, wherein a first portion of the top surface of the photomask is covered by the first portion of the adhesive prior to removing the first portion of the adhesive.

3. The method of claim 2, wherein the first portion of the top surface of the photomask is exposed from the adhesive after performing the mechanical impact.

4. The method of claim 1, wherein the mechanical impact comprises megasonic cleaning.

5. The method of claim 1, wherein the adhesive is made of acrylic-based compound, rubber-based compound, polybutene-based compound, polyurethane-based compound, or silicon-based compound.

6. The method of claim 1, wherein the alkaline solution comprises tetramethylammonium hydroxide (TMAH).

7. The method of claim 1, wherein a second portion of the adhesive is remained on the pellicle frame.

8. The method of claim 1, wherein applying the ozonated deionized water over the top surface of the photomask further comprises: sequentially applying the ozonated deionized water and radiated ozonated deionized water over the top surface of the photomask.

9. The method of claim 1, wherein the mechanical impact is performed after applying the alkaline solution.

10. A method for cleaning a substrate, comprising:
    removing adhesive on a top surface of a photomask, comprising:
        sequentially applying ozonated deionized water and radiated ozonated deionized water over the top surface of the photomask;
        applying TMAH solution over the top surface of the photomask after applying the ozonated deionized water and the radiated ozonated deionized water over the top surface of the photomask for altering molecular bonding of the adhesive thereon; and
        performing a megasonic cleaning on the remaining adhesive, wherein a portion of the top surface of the photomask is exposed from the adhesive subsequent to the megasonic cleaning.

11. The method of claim 10, wherein the megasonic cleaning is performed subsequent to the application of TMAH solution.

12. The method of claim 10, wherein the adhesive is made of acrylic-based compound, rubber-based compound, polybutene-based compound, polyurethane-based compound, or silicon-based compound.

13. The method of claim 10, further comprising removing a pellicle from the photomask prior to applying ozonated deionized water to the top surface of the photomask.

14. A method for cleaning, comprising:
    receiving a photomask, wherein a first portion of a surface of the photomask is covered by an adhesive material;
    applying ozonated deionized water over the top surface of the photomask to oxidize the adhesive material;
    applying an alkaline solution to the oxidized adhesive material on the surface of the photomask; and
    performing a mechanical impact to the photomask to remove at least a portion of the adhesive material.

15. The method of claim 14, wherein the mechanical impact is performed after applying the alkaline solution.

16. The method of claim 14, further comprising applying radiated ozonated deionized water over the surface of the photomask.

17. The method of claim 16, wherein the application of the radiated ozonated deionized water is prior to the application of the alkaline solution.

18. The method of claim 14, wherein the alkaline solution comprises tetramethylammonium hydroxide (TMAH).

19. The method of claim 14, wherein the adhesive material comprises acrylic-based compound, rubber-based compound, polybutene-based compound, polyurethane-based compound, or silicon-based compound.

20. The method of claim 14, wherein the mechanical impact comprises megasonic cleaning.

* * * * *